United States Patent
Tzu et al.

[19]

[11] Patent Number: 6,101,101

[45] Date of Patent: Aug. 8, 2000

[54] UNIVERSAL LEADFRAME FOR SEMICONDUCTOR DEVICES

[75] Inventors: Chung-Hsing Tzu, Taipei Hsien; Jung-Yu Lee, Hsin Chu Hsien, both of Taiwan

[73] Assignee: Sampo Semiconductor Corporation, Taipei, Taiwan

[21] Appl. No.: 09/085,447

[22] Filed: May 28, 1998

[51] Int. Cl.[7] .................................................. H01L 23/495
[52] U.S. Cl. ........................ 361/808; 361/813; 257/666; 257/676; 257/783; 257/787; 174/52.4; 438/123; 438/124
[58] Field of Search ........................... 174/52.4; 257/666, 257/672, 676, 787, 782, 783; 361/813, 807, 808; 438/123, 124, 127

[56] References Cited

U.S. PATENT DOCUMENTS 5,942,794  8/1999  Okumura et al. ....................... 257/666
5,977,615  11/1999  Yamaguchi et al. ..................... 257/666

FOREIGN PATENT DOCUMENTS 63-128655  6/1988  Japan ..................................... 257/676
1-80055    3/1989  Japan .
1-181450   7/1989  Japan ..................................... 257/676
5-29493    2/1993  Japan .

*Primary Examiner*—Jeffrey Gaffin
*Assistant Examiner*—John B. Vigushin
*Attorney, Agent, or Firm*—Rosenberg, Klein & Lee

[57] ABSTRACT

A leadframe for semiconductor devices is characterized in that the edge of the paddle has the shape of inclined plane which facilitate the silver epoxy to fill up the gap near the edge of the epoxy. The inclined plane on the paddle can also prevent the excessive silver epoxy from leaking to the bottom side of the paddle, which may cause delamination due to the poor adhesion between silver epoxy and plastic resin. Therefore the leadframe of the present utility can prevent moisture from accumulating within the package and the problem of pop corn.

1 Claim, 4 Drawing Sheets

UNIVERSAL LEADFRAME FOR SEMICONDUCTOR DEVICES

FIELD OF THE INVENTION

The present invention relates to a leadframe for semiconductor devices and the method for making the same, more particularly to a leadferame for semiconductor devices by which the pop corning and the cracking of the package can be prevented, and the reliability can be enhanced, and the method for making the same.

BACKGROUND OF THE INVENTION

Conventionally, after an IC package is finished, it is delivered a downstream manufacturer to mount on a circuit board. During the delivery process, the silver epoxy between the chip and chip paddle is liable to separate (or delaminate) from the chip due to the thermal stress between the chip and chip paddle caused by the temperature variation. The delamination of the silver epoxy creates a gap where moisture tends to accumulate. Moreover, to mount the packaged IC on the circuit board, the IC is subjected to a high temperature solder reflow process. The high temperature process will evaporate the above-mentioned moisture in the delamination region, therefore, the undesirable pop-corning and cracking is occurred.

FIG. 1 and FIG. 2 shows the conventional package of IC. As shown in FIG. 1, The chip 13 is mounted on a chip paddle 11 with a smaller size. The chip 13 is adhered to the top of the chip paddle 11 by a silver epoxy 12. The bond pad of the chip 13 is electrically connected to the inner lead 15 of the leadframe through a bonding wire 14. The resultant structure is then encapsulated ay a plastic resin to form a complete packaged structure 10, as shown in FIG. 2. However, the above process has considered the attaching force between the chip and the paddle only, and is subjected to some problems. In one aspect, if the amount of the silver epoxy is deficient, the plastic resin is hard to fill up the space formed between the chip 13 and paddle 11, and beside the silver epoxy 12. Therefore, a gap or a void where the moisture is liable to accumulate is formed. The accumulated moisture will lead to the pop-corning and the cracking of the package during a high-temperature reflow process. In another aspect, if the amount of the silver epoxy is excessive, the silver epoxy 12 is apt to leak out of the adhesion region of the chip 13 and the paddle 11. The leakage of the silver epoxy 12 will contaminate the processing apparatus and then attach to the bottom surface of the paddle 11. The silver epoxy 12 on the bottom surface of the paddle 11 will deteriorate the binding force between the leadframe and the plastic resin due to the poor adhesive force between the silver epoxy 12 and the plastic resin. Therefore, a delamination problem is also occurred and the pop-corning of the package due to the evaporation of the accumulated moisture is hard to prevent.

SUMMARY OF THE INVENTION

The object of the present invention is to present a leadframe for semiconductor devices wherein each of the four edge of the paddle is formed in a inclined-plane fashion to facilitate the plastic resin to fill up the gap between the chip and the paddle, and to prevent the occurrence of the delamination caused by the leakage of the silver epoxy, whereby the reliability of the package can be enhanced, and the tolerant range of silver epoxy leakage can be broadened, as well as the process can be simplified.

To enable better understanding of the objectives, configuration, structure or device characteristics and functions of the subject invention, please refer to the following detailed description with drawings;

BRIEF DESCRIPTION OF NUMERALS

Figure 1:
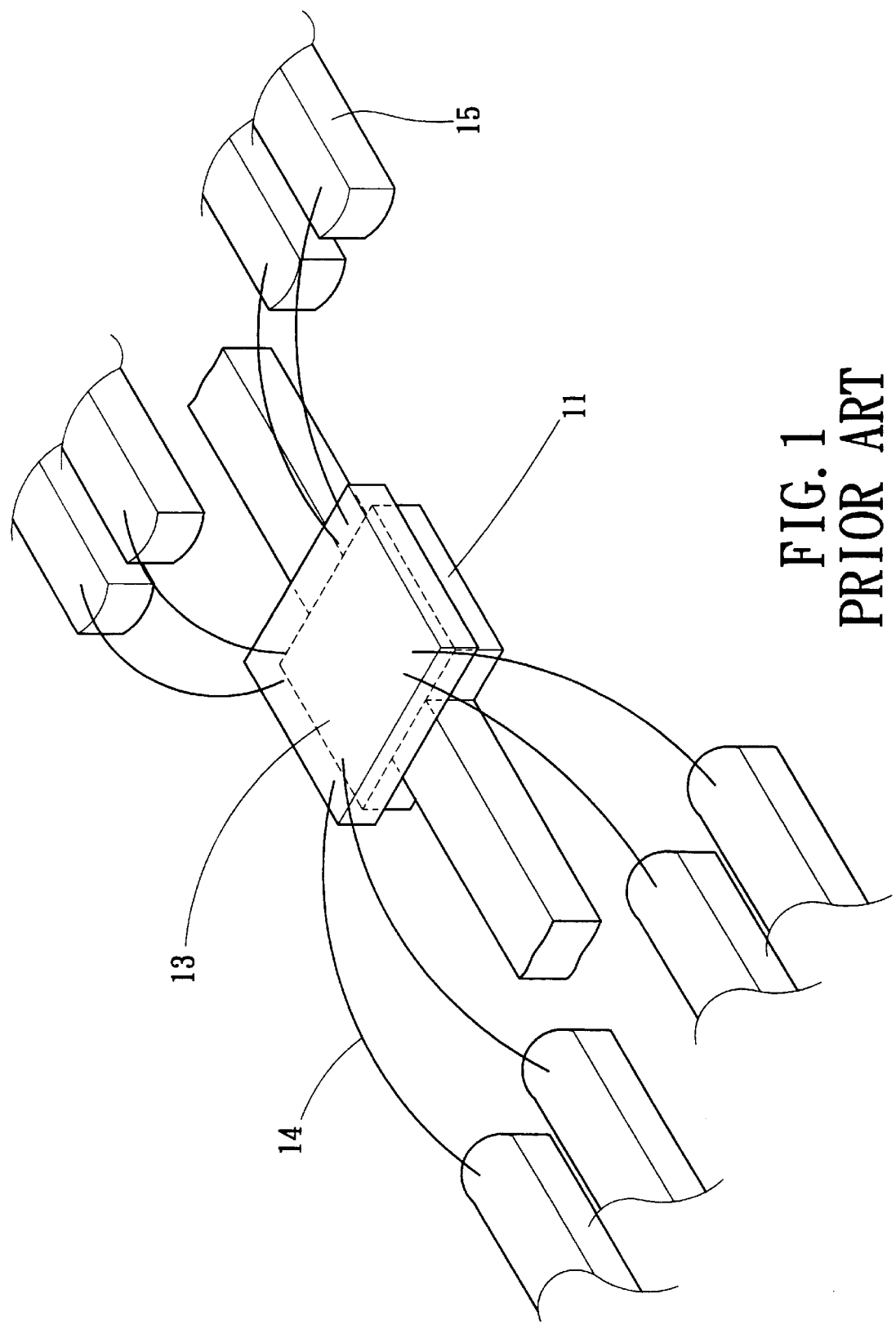
FIG. 1 is a perspective view of a paddle in a prior art of package.

10 IC package
11 die paddle
12 silver epoxy
13 die
14 bonding wire
15 inner lead of leadframe
16 plastic resin
17 inclined plane

DETAILED DESCRIPTION OF PREFERRED EMBODIMENT

Figure 2:
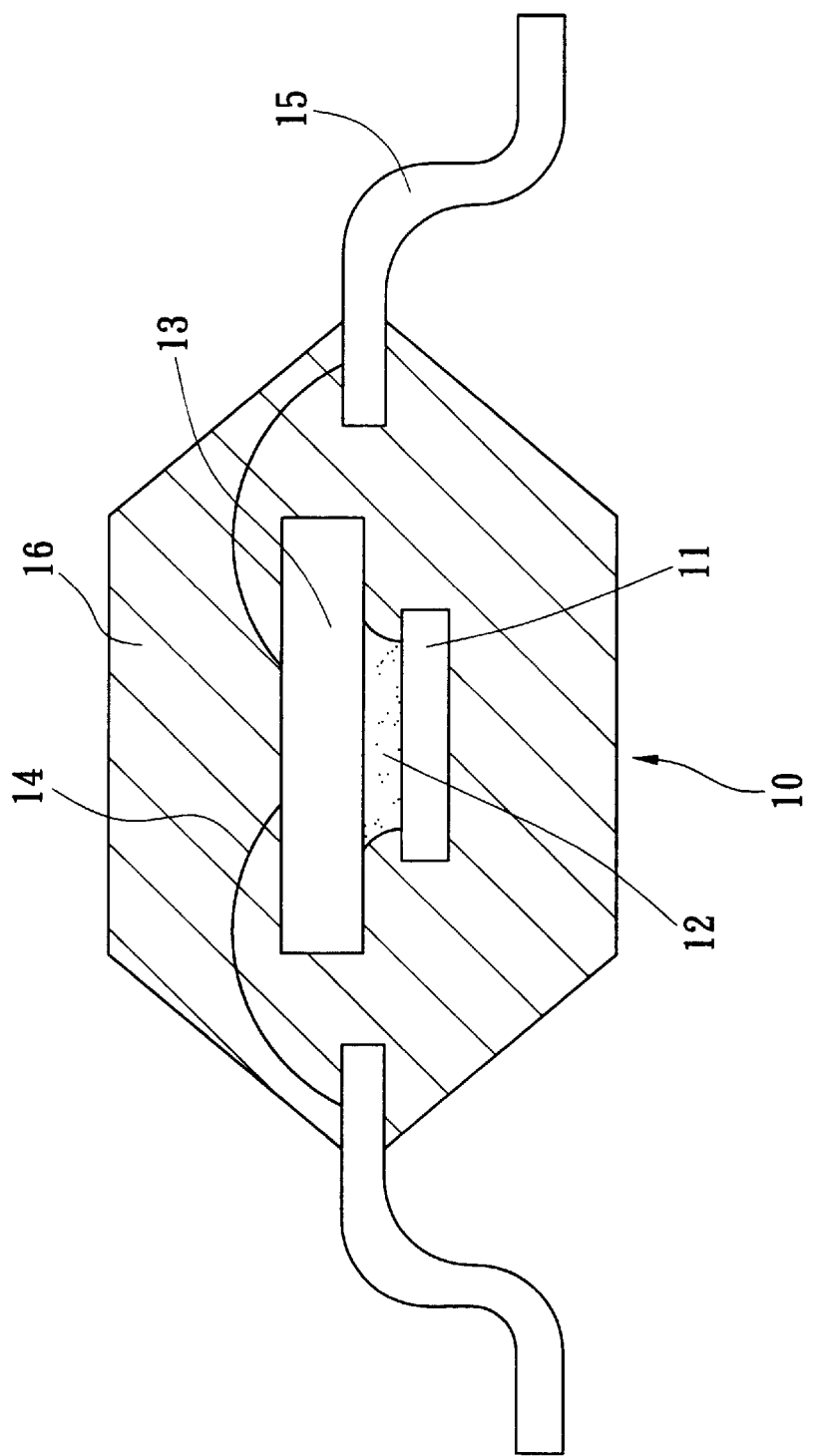
FIG. 2 is a cross section view of an IC package of prior art.

As shown in FIG. 2, if the amount of the silver epoxy 12 is deficient, the plastic resin 16 is hard to fill up the space formed between the chip 13 and paddle 11, and beside the silver epoxy 12. Therefore, a gap or a void where the moisture is liable to accumulate is formed. The accumulated moisture will lead to the pop-corning and the cracking of the package during a high-temperature reflow process. Moreover, if the amount of the silver epoxy is excessive, the silver epoxy 12 is apt to leak out of the adhesion region of the chip 13 and the paddle 11. The leakage of the silver epoxy 12 will contaminate the processing apparatus and then attach to the bottom surface of the paddle 11. The silver epoxy 12 on the bottom surface of the paddle 11 will deteriorate the binding force between the leadframe and the plastic resin due to the poor adhesive force between the silver epoxy 12 and the plastic resin. Therefore, a delamination problem is occurred and the pop-corning of the package due to the evaporation of the accumulated moisture is hard to prevent.

Figure 3:
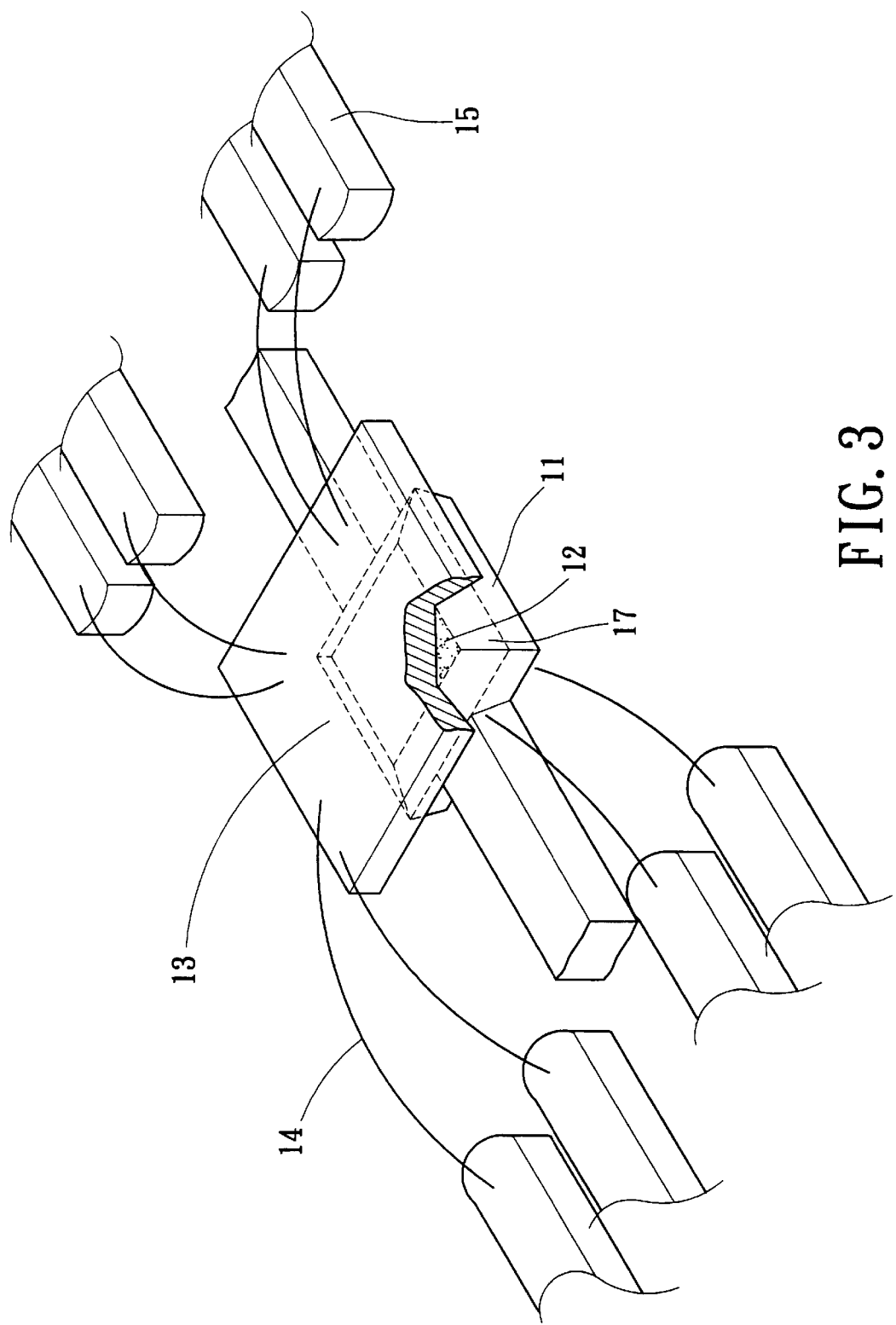
FIG. 3 is a perspective view of the paddle in the present invention.
Figure 4:
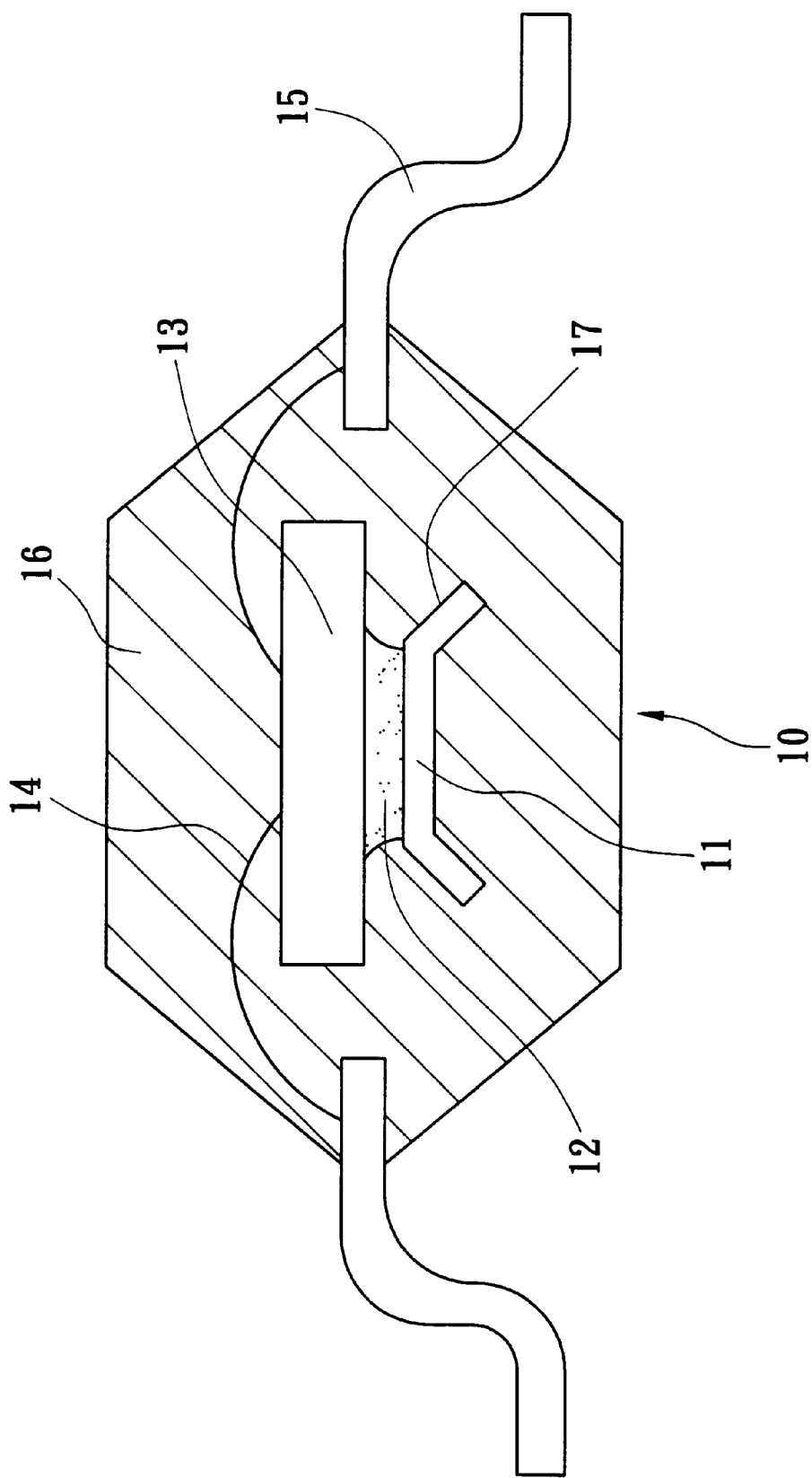
FIG. 4 is a cross section view of the IC package in present invention.

Please refer to FIGS. 3 and 4, which illustrate the present invention. To prevent gap or void from being formed beside the silver epoxy 12, the four edge of the paddle 11 is formed in a inclined-plane fashion to facilitate the plastic resin to fill up the gap between the chip 13 and the paddle 11. Moreover, the paddle 11 in above-mentioned shape can prevent the occurrence of the delamination layer caused by the leakage of the silver epoxy, whereby the reliability of the package can be enhanced, and the tolerant range of silver epoxy leakage can be broadened, as well as the process can be simplified.

Summing up, the present invention, with effective prevention of interior delamination layer formed within the package and racking of the package, will enhance the reliability of the package, and has great initial applicability. It is an innovative creation with novelty and originality that will fully satisfy the qualifications for patent right, hence this application is filed in accordance with the Patent Law to protect the present inventor's rights and interests. Your favorable consideration would be appreciated. Should you have any doubts or questions, please feel free to keep me advised.

I hereby declare that the above description, covering only the preferred embodiment of the subject invention, should not be used to limit or restrict the subject claim, and that all equivalent structural and/or configurational variations and/or modifications (such as the designs of any other shapes or forms of the inclined surfaces on the four sides of the paddle) easily conceivable to anyone skilled in the subject art and deriving from the subject description with drawings herein shall reasonably be included in the intent of the subject claim.

What is claimed is:

1. A lead frame for a semiconductor device including a chip having a bottom surface secured to said lead frame by silver epoxy, said semiconductor device being encapsulated by plastic resin, wherein a problem of delamination between said chip, said silver epoxy and said lead frame is substantially eliminated, said lead frame comprising:

a chip paddle, said chip paddle having a central flat portion and substantially flat inclined plane extending from a perimeter of said flat portion of said chip paddle and forming a substantially closed contour therearound, said chip being bonded to said chip paddle by said silver epoxy disposed between said central flat portion of said chip paddle and a corresponding first portion of said bottom surface of said chip, said bottom surface of said chip having a second portion devoid of said silver epoxy surrounding said first portion thereof, said second portion extending beyond said chip paddle, and said plastic resin substantially completely filling a gap defined between said second portion of said bottom surface of said chip and said chip paddle.

* * * * *